United States Patent
McMillan et al.

(10) Patent No.: US 6,297,458 B1
(45) Date of Patent: Oct. 2, 2001

(54) PRINTED CIRCUIT BOARD AND METHOD FOR EVALUATING THE INNER LAYER HOLE REGISTRATION PROCESS CAPABILITY OF THE PRINTED CIRCUIT BOARD MANUFACTURING PROCESS

(75) Inventors: Thad McMillan; Gita Khadem, both of Austin, TX (US)

(73) Assignee: Dell USA, L.P., Round Rock, TX (US)

( * ) Notice: Subject to any disclaimer, the term of this patent is extended or adjusted under 35 U.S.C. 154(b) by 0 days.

(21) Appl. No.: 09/291,766

(22) Filed: Apr. 14, 1999

(51) Int. Cl.$^7$ ..................................................... H05K 1/11
(52) U.S. Cl. ..................... 174/250; 174/262; 174/264; 174/266; 361/777; 361/792; 361/795
(58) Field of Search ..................... 174/250, 261, 174/262, 264, 266; 361/774, 777, 792, 795

(56) References Cited

U.S. PATENT DOCUMENTS

| | | | |
|---|---|---|---|
| 3,243,498 | * | 3/1966 | Allen et al. ........................... 174/266 |
| 3,250,848 | * | 5/1966 | Beelitz et al. ........................ 174/264 |
| 3,859,711 | | 1/1975 | McKiddy . |
| 3,876,822 | * | 4/1975 | Davy et al. ........................... 174/266 |
| 4,258,468 | * | 3/1981 | Balde ................................... 174/266 |
| 4,432,037 | | 2/1984 | Brabetz . |
| 4,438,560 | * | 3/1984 | Kisters ................................. 361/792 |
| 4,510,446 | | 4/1985 | Braun et al. . |
| 4,636,919 | * | 1/1987 | Itakura et al. ........................ 174/261 |
| 4,894,606 | | 1/1990 | Paur . |
| 4,898,636 | | 2/1990 | Rigling . |
| 4,918,380 | | 4/1990 | Paur . |
| 5,066,908 | | 11/1991 | Takahashi . |
| 5,111,406 | | 5/1992 | Zachman et al. . |
| 5,182,421 | | 1/1993 | Mouri . |
| 5,191,174 | * | 3/1993 | Chang et al. ......................... 174/266 |
| 5,319,159 | * | 6/1994 | Watanabe et al. .................... 174/262 |
| 5,529,441 | | 6/1996 | Kosmowski et al. . |
| 5,538,433 | * | 7/1996 | Arisaka ................................ 174/266 |
| 5,817,986 | * | 10/1998 | Davidson et al. .................... 174/250 |
| 5,955,704 | * | 9/1999 | Jones et al. ........................... 174/262 |

* cited by examiner

*Primary Examiner*—Jeffrey Gaffin
*Assistant Examiner*—John B. Vigushin
(74) *Attorney, Agent, or Firm*—Haynes and Boone, L.L.P.

(57) ABSTRACT

A printed circuit board includes a plurality of dielectric substrates. Each of the dielectric substrates includes a first and a second surface and has a first conductive layer formed on the first surface of the respective dielectric substrate. A first pattern of lands is formed in the conductive layer of at least two of the dielectric substrates. The pattern of lands of each dielectric substrate is substantially the same. An opening is formed through each of the lands to expose the respective dielectric substrate. Each of the openings in a respective pattern of lands has a diameter different than at least a portion of the other openings in the same pattern. The plurality of dielectric substrates are laminated in stacked relationship.

16 Claims, 3 Drawing Sheets

PRINTED CIRCUIT BOARD AND METHOD FOR EVALUATING THE INNER LAYER HOLE REGISTRATION PROCESS CAPABILITY OF THE PRINTED CIRCUIT BOARD MANUFACTURING PROCESS

BACKGROUND

The disclosures herein relate to computer systems and more particularly, to an apparatus and method for determining printed circuit board process capabilities for use in computer systems.

Multi-layer printed circuit board (hereinafter referred to as PCB) manufacturing and design techniques are well known. In typical PCB designs, there is at least one conductive disk or pad formed on each conductive layer of copper on the inner layers of a PCB. Plated through holes are formed by plating holes formed through a stack of conductive disks or pads. These through holes can be created by mechanical drilling, chemical etching or other techniques.

However, due to manufacturing processing each conductive layer can be misaligned with the plated holes. If a plated hole is misaligned it can break out of the disk and short to adjacent circuitry resulting in a defective board. An unintentional connection within a layer or failure to connect to an intended layer may result in the PCB not performing its intended function. Mis-registration resulting in plated through holes being close to another plated feature but not touching it may also result in adverse performance conditions or increases potential for failure over time.

The design diameter of these disks are determined by the capability of the printed circuit board manufacturer to register plated holes to the conductive disks. In high density printed circuit boards, the size of a plated feature such as plated through hole (hereinafter referred to as PTH) are very small. Due to the tight spacing of plated features in high density PCBs, it is essential that the PTHs be a reliable distance from adjacent plated features. Due to the weight and size requirements of electronic devices, the size of plated through holes in high density PCBs continues to decrease. With this being the case, the potential for one or more of the plated through holes to short to an adjacent plated feature during the fabrication of the PCB also increases. Therefore, it is desirable to determine that the plated through holes are a reliable distance from adjacent plated features prior to integrating the PCB into a related electronic device.

Destructive test methods such as micro-sectioning are commonly used to verify the alignment and spacing of plated features. Destructive test methods are based on statistical sampling processes. They are limited in usefulness and practicality for testing PCBs since every PCB cannot be examined. As there can be thousands of plated through holes in a PCB, the possibility exists that a process condition leading to a defective PCB will not be identified by the statistical sampling process. Furthermore, the cost associated with destructive test methods is proportional to the quantity of samples tested.

Various non-destructive techniques for testing a printed circuit board for misregistration are also known. Some of these techniques simply check for plated features that are unintentionally in contact with or too close to another plated features. These types of techniques can be used for 100% quality inspection, but they do not readily aid in quantifying and improving the printed circuit board manufacturing process capability.

Other types of techniques are intended to determine optimized drilling operation such that the potential for a defective board is minimized. Some of these techniques are based on selecting a drill size. Others are based on selecting an optimized drilling position that minimizes the potential for failure. For many of these techniques, a secondary test operation is still required to determine the statistical probability of a defective PCB. Furthermore, these types of techniques do not readily aid in quantifying and improving the printed circuit board manufacturing process capability.

Accordingly, a need has arisen for a registration test method that overcomes the shortcomings of the previous techniques and, in particular, for an apparatus and method to determine the limitations of a known process for manufacturing PCBs. Incorporation of the apparatus into a PCB may be accomplished by conventional PCB manufacturing processes to support a non-destructive method of quantifying the PCB manufacturing process capability. This method allows for determining the printed circuit board manufacturer's capability to register plated holes relative to the inner conductive layers of a PCB. Accordingly, the design diameter for the pads may be determined.

SUMMARY

One embodiment, accordingly, provides an apparatus for quantifying the PCB manufacturing process capability. This allows the process limitations of the manufacture of the PCB to be better understood and to be utilized in optimizing the design and manufacture of the PCB. To this end, a printed circuit board has a plurality of dielectric substrates laminated in a stacked relationship. Each of the dielectric substrates includes a first and a second surface and has a first conductive layer formed on the first surface. A first pattern of lands is formed in the conductive layer of at least two of the dielectric substrates. The pattern of lands of each dielectric substrate is substantially the same as the first pattern of lands of each other substrate. An opening is formed through each of the lands to expose the respective dielectric substrate. Each of the openings in a respective pattern of lands has a diameter different than at least a portion of the other openings.

An apparatus according to the illustrative embodiments presented herein provides several advantages and benefits. The inherent characteristics of a known process for making a PCB may be quantified. It is also advantageous that a non-destructive method of quantifying the PCB manufacturing process capability may be utilized. Furthermore, incorporation of the apparatus is transparent to the manufacture of the PCB. As such, the apparatus does not impart any extraneous or unintended characteristics to the PCB.

BRIEF DESCRIPTION OF THE DRAWINGS FIGURES

DETAILED DESCRIPTION

Figure 1:
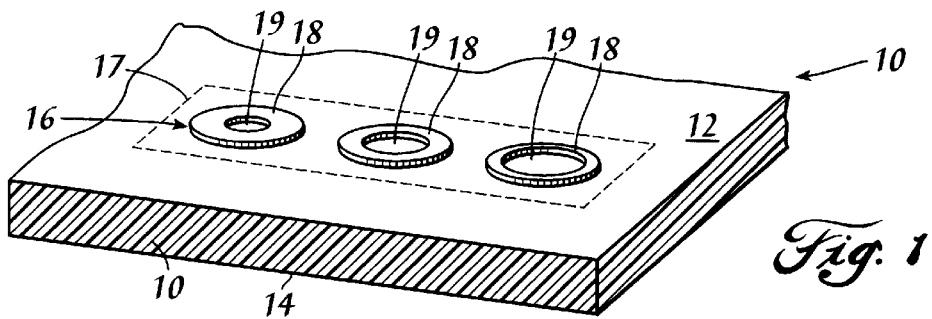
FIG. 1 is a fragmentary cross-sectional view showing an illustrative embodiment of a first dielectric substrate having a pattern of lands formed in a first conductive layer.

FIG. 1 shows an illustrative embodiment of a first dielectric substrate 10 having a first side 12 and a second side 14. A first conductive layer 16 is formed on the first side 14 of the first dielectric substrate 10. The first conductive layer is patterned to form a first pattern 17 of lands 18. The lands 18 are discrete whereby they are electrically isolated from each other. Each land 18 has an opening 19 formed through it to expose the first dielectric substrate 10.

Figure 2:
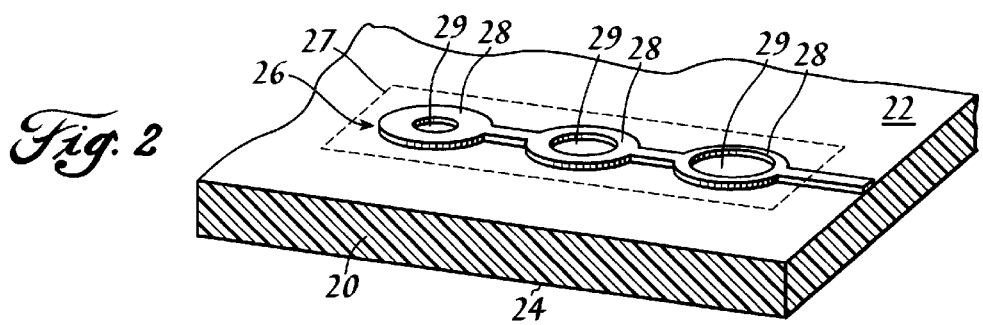
FIG. 2 is a fragmentary cross-sectional view showing an illustrative embodiment of a second dielectric substrate having a pattern of lands formed in a first conductive layer.

FIG. 2 shows an illustrative embodiment of a second dielectric substrate 20 having a first side 22 and a second side 24. A second conductive layer 26 is formed on the first side 22 of the second dielectric substrate 20. The second conductive layer 26 is patterned to include a second pattern 27 of lands 28. Each land 28 has an opening 29 formed through it to expose the second dielectric substrate 10. A buss 30 electrically couples each of the plurality of lands formed in the second dielectric substrate 20. The second pattern 27 of lands 28 is substantially the same as the first pattern 17 of lands 18.

It is contemplated that a conductive layer having a pattern of lands formed therein may be provided on the second side of at least one dielectric substrate in a printed circuit board. A two-sided construction will enable the process capability relative to a two side metallization process to be evaluated. Also, although the illustrative embodiments shown have two dielectric substrate layers, printed circuit boards having more than two dielectric substrate layers will also benefit from the inventive aspects of the present embodiments. Processes for manufacturing a two side metallized dielectric substrate as well as multi-layer printed circuit boards are well known. More than one sets of patterns of lands may be used on a printed circuit board.

Figure 3:
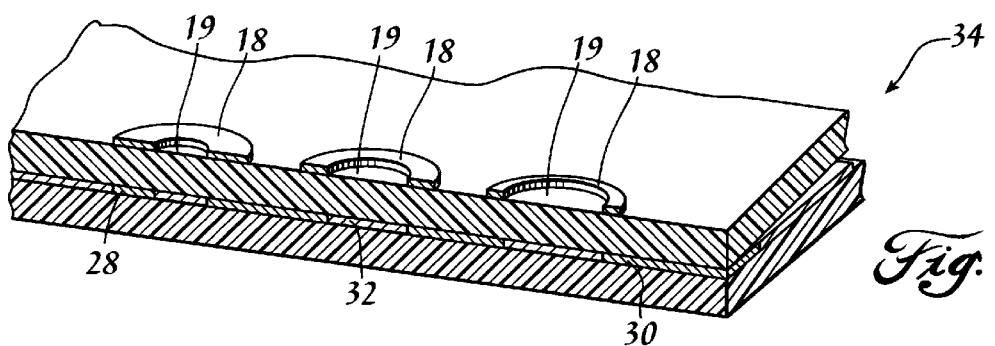
FIG. 3 is a fragmentary cross-sectional view showing an illustrative embodiment of a printed circuit board.

As shown in FIG. 3 the first dielectric substrate 10 is laminated to the second dielectric substrate 20 using a laminating material 32 to form a multi-layer printed circuit board 34. The first and second dielectric substrates 10, 20 are laminated such that the second pattern 27 of lands 28 is substantially aligned with the first pattern 17 of lands 18. The specific manufacturing processes used will dictate the degree of alignment between the patterns of lands.

Each of the openings 19, 29 in a respective pattern 17, 27 of lands 18, 28 have a diameter different than at least a portion of the other openings 19, 29. In a preferred embodiment, the opening 19, 29 and the lands 18, 28 are circular-shaped. The diameter of each opening 19 of the first pattern 17 is substantially the same as the diameter of the adjacent aligned opening 29 of the second pattern 27.

Figure 4:
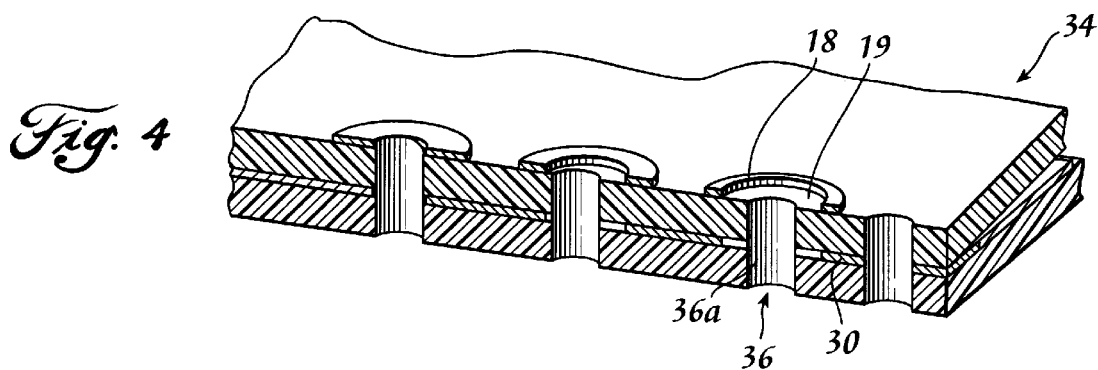
FIG. 4 is a fragmentary cross-sectional view showing the printed circuit board of FIG. 3 having through holes formed through the dielectric substrates.
Figure 5:
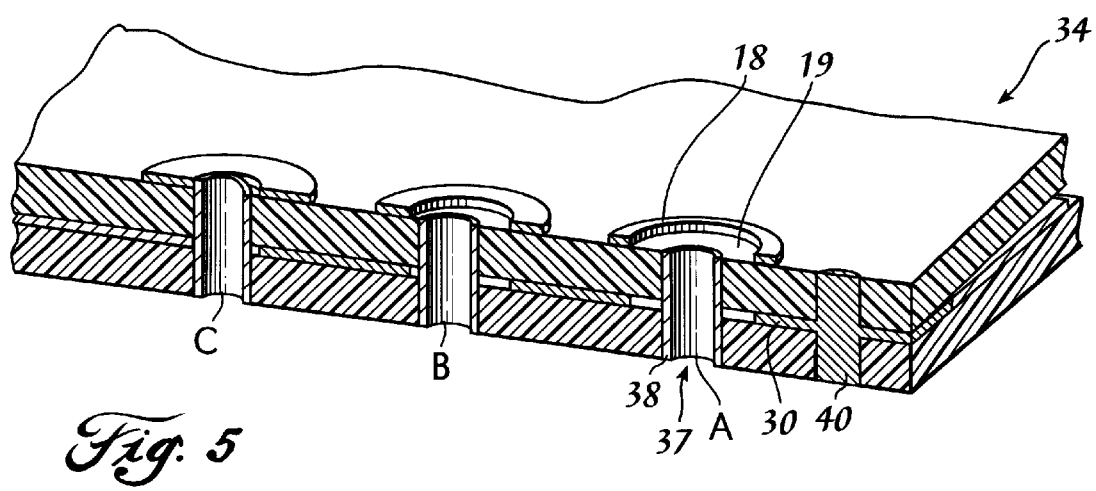
FIG. 5 is a fragmentary cross sectional view showing three different through hole orientations relative to the respective land.
Figure 6:
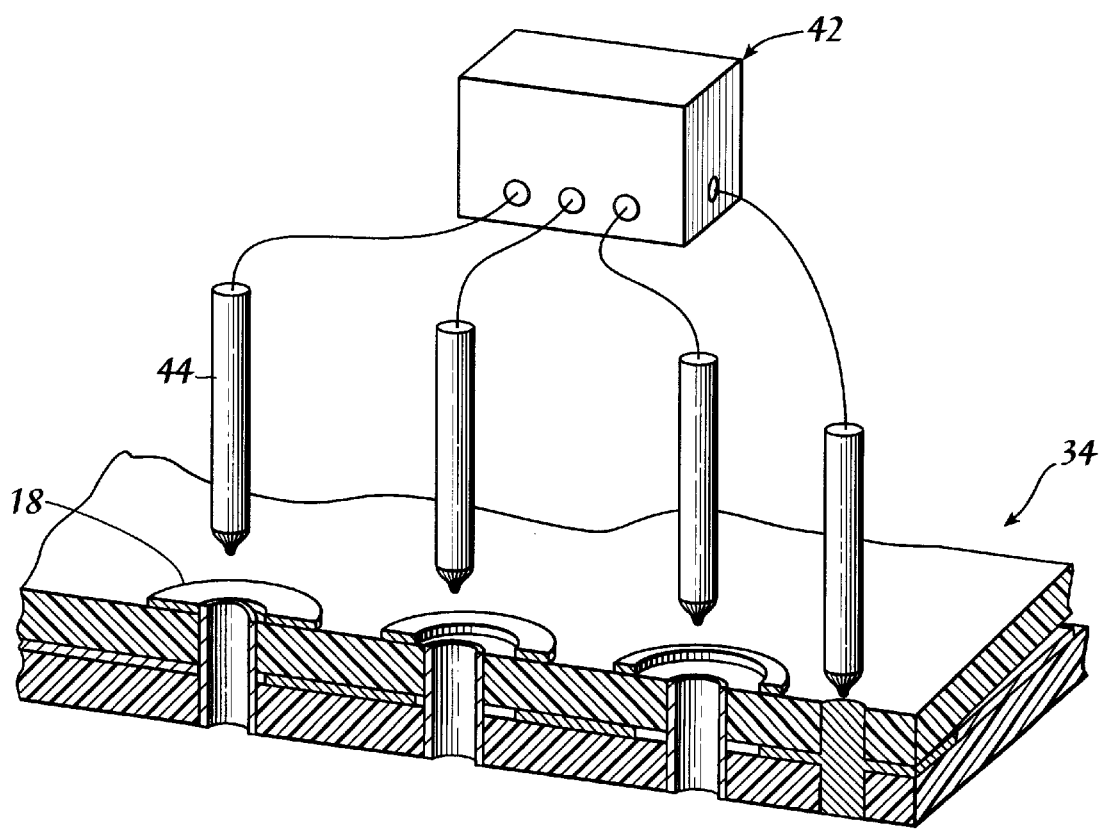
FIG. 6 is a perspective partially cross-sectional view showing an illustrative embodiment of a test apparatus coupled to a printed circuit board.

An illustrative embodiment of a method of using a printed circuit board according to the present embodiments is shown in FIGS. 4–6. Two or more patterns 17, 27 of electrically conductive lands 18, 28 may be used to electrically determine the PCB manufacturing process capability. At least two holes in the patterns 17, 27 are of different diameters. Through holes 36 are formed through the printed circuit board 34. The holes may be formed using a process such as mechanical or laser drilling. A conductive material is then formed on the interior surface 36a of each through hole 36 using a process such as electro-less plating to form a plated through hole 37. A common contact 40 may be provided by forming a through hole 36 through the printed circuit board 34 to intersect with the buss 30 and plating it. Depending on the size of the through hole 36 and the plating process employed, the resulting plated through hole 37 may be of an open type (as shown) or a blind-type (similar to the common contact 40 shown).

Various steps of the manufacturing process will contribute to determining how accurately and repeatably the printed circuit board is constructed. There are at least three key alignment parameters that must be considered in the manufacture of a printed circuit board. They are the alignment of features such as lands within a pattern; the alignment of features of one dielectric substrate relative to features of another dielectric substrate and the positioning of plated through holes formed at various positions in the printed circuit board. Each of these parameters contributes to determining the yield of the manufacturing process.

As best shown in FIG. 5, the three alignment parameters discussed above may result in at least three possible conditions. In condition "A", the alignment parameters are optimized and the through hole 36 is substantially centered relative to the lands 18, 28 of the respective dielectric substrates 10, 20. In this condition, the conductive material 38 on the interior surface 36a of the through hole 36 does not contact the lands 18, 28. Due to variability and tolerance in any manufacturing process, it will generally not be practical nor economical to achieve condition "A". In condition "B", the alignment parameters are less than optimum and the through hole 36 is not centered relative to at least one of the lands 18, 28. Although the conductive material 38 of the interior surface 36a of the through hole 36 is not in contact with either of the lands 18, 28, under certain environmental conditions, a short can occur between one of the lands and the conductive material on the interior surface 36a of the through hole 36. In condition "C", the alignment parameters do not meet the minimum acceptable requirement and the conductive material 38 is in contact with at least one of the lands 18, 28.

FIG. 6 shows an illustrative embodiment of an electrical test apparatus 42 for testing the printed circuit board 34 to evaluate the process capability. The test apparatus 42 includes a plurality of probes 44 for contacting the lands 18 and the common contact 40. The probes 44 are electrically coupled to test apparatus 42, that performs one or more performance tests on the printed circuit board 34. The technique for electrically connecting the test apparatus 42 to the printed circuit board 34 may also include using an edge card connector connected to an edge portion of the printed circuit board.

After a series of PCB are run through the PCB manufacturing process each pattern of lands may be electrically tested. For example, in a continuity test, a short to a land indicates the diameter at which the process is NOT capable. An open to the land indicates the diameter at which the process is capable. Taken collectively on a series of boards, a distribution of capable diameters can be statistically assessed to determine the true capability of the PCB process to register to a given diameter pad size. This data can be used to determine process capability limits of registration for different drill sizes. This data can be used to establish design rules to determine the minimum pad sizes needed for a given hole size.

To provide automated test capability, the test apparatus may be coupled to a data acquisition system for providing automated test capability. The test apparatus would provide a probe or other means of making electrical connection with the plated through holes being evaluated. The data acquisition system would automatically test each plated through hole to determine its condition.

The process capability can be evaluated by a number of different types of electrical performance evaluations. A continuity test may be used wherein a short circuit (condition "C") occurs between a land and plated through hole 37. This test does not provide a distinction between conditions "A" and "B".

An electrical performance test for measuring impedance for a given plated through hole will provide a distinction for a given through hole. Condition "C" will be identified as an in impedance of substantially 0.0 ohms. However, when employing a capacitance-type electrical performance evaluation, a finite difference in the impedance value will be exhibited for plated through holes exhibiting conditions in the range between conditions "A" and "C". This will provide a technique for approximating the distance between the plated through hole and the nearest land. Accordingly, an impedance-type evaluation technique is desirable to identify printed circuit boards that may not meet the desired long-term reliability specification. It is contemplated that other types of electrical performance evaluations such as dielectric breakdown and capacitance tests may be employed to evaluate the process capability of a given manufacturing process.

Figure 7:
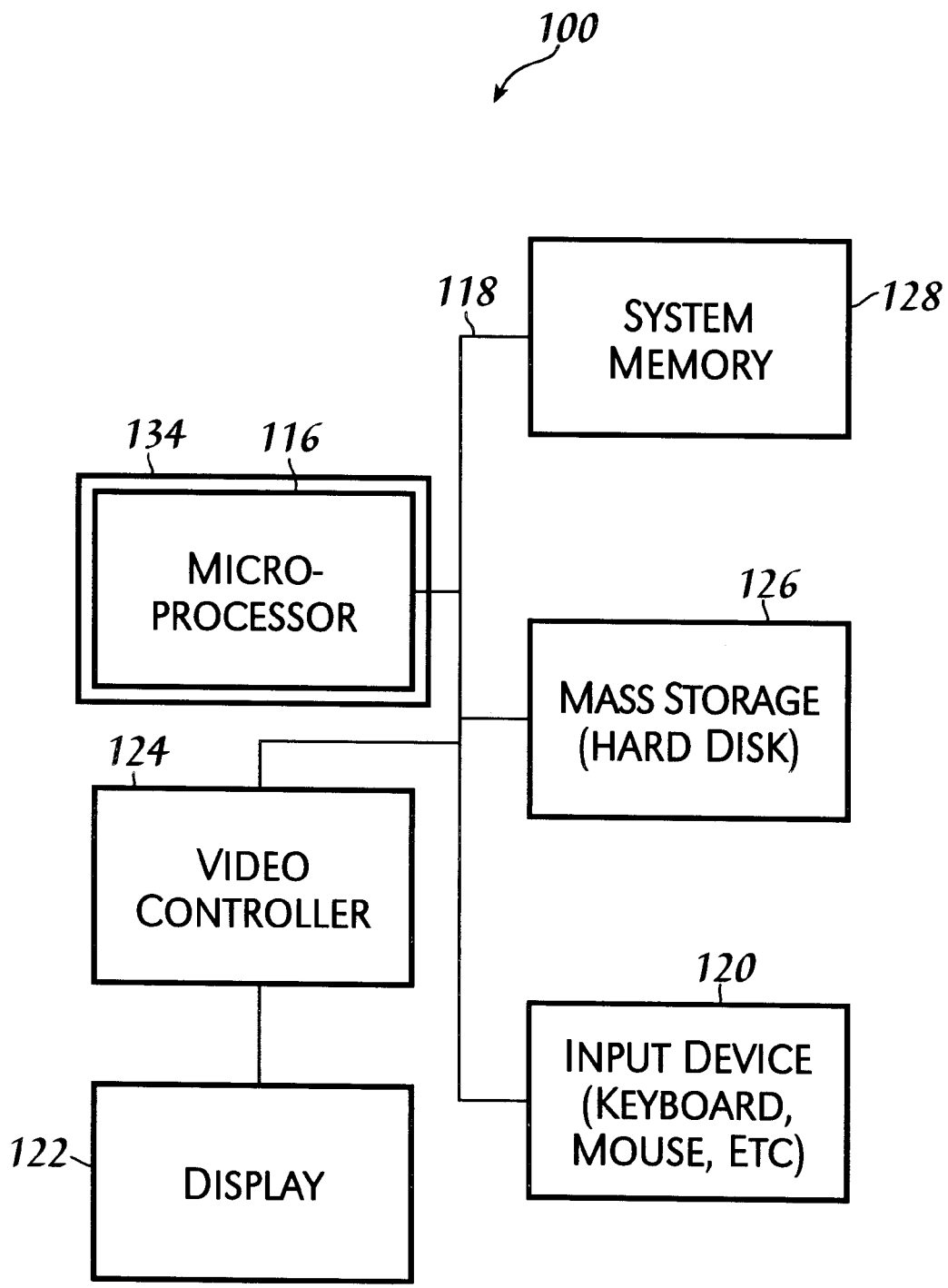
FIG. 7 is a block diagram of an embodiment of a computer system.

FIG. 7 shows an embodiment of a computer system, indicated generally at 100. The computer system 100 includes a microprocessor 116 mounted on a printed 10 circuit board printed circuit board 134. The microprocessor 116 is connected to a bus 118. The bus 118 serves as a connection between the microprocessor 116 and other components of the computer system 100. An input system 120 is coupled to the microprocessor 116 to provide input to the microprocessor 16. Examples of input systems include keyboards, touchscreens, and pointing devices such as a mouse, a trackball and a trackpad. The computer system 100 further includes a display 122 which is coupled to the microprocessor 116 typically by a video controller 124. Programs and data are stored on a mass storage device 126 which is coupled to the microprocessor 116. Mass storage devices include components such as hard disks, optical disks, magneto-optical drives, floppy drives, and the like. The system memory 128 provides the microprocessor 116 with fast storage to facilitate execution of computer programs by the microprocessor 116. It should be understood that other busses and intermediate circuits can be employed between the components described above and microprocessor 116 to facilitate interconnection between the components and the microprocessor.

In operation, the embodiments disclosed herein provide a multi-layer PCB and a method of using the PCB to evaluate the process capability of the manufacturing process used to make the PCB. The PCB includes a plurality of dielectric substrate layers having a conductive layer formed on at least one side thereof. Each dielectric substrate has a test coupon formed in the conductive layer and each of the test coupons includes a plurality of plated lands. Each of the plated lands has a different size inside diameter. The plurality of dielectric substrate layers are laminated together with the test coupon of each layer substantially aligned with each other. Through holes of a common diameter are formed through the PCB at each of the lands and the interior wall of the through holes are plated. An electrical performance evaluation is conducted between the conductive layer on the through hole and each land.

As a result, one embodiment provides a printed circuit board having a plurality of dielectric substrates. Each of the dielectric substrates includes a first and a second surface and has a first conductive layer formed on the first surface of the respective dielectric substrate. A first pattern of lands is formed in the conductive layer of at least two of the dielectric substrates. The pattern of lands of each dielectric substrate is substantially the same. An opening is formed through each of the lands to expose the respective dielectric substrate. Each of the openings in a respective pattern of lands has a diameter different than at least a portion of the other openings in the same pattern. The plurality of dielectric substrates being laminated in stacked relationship.

Another embodiment provides a computer system including a microprocessor mounted on a printed circuit board; an input coupled to provide input to the microprocessor; a mass storage coupled to the microprocessor; a display coupled to the microprocessor by a video controller; and a system memory coupled to provide storage to facilitate execution of computer programs by the microprocessor. The printed circuit board includes a plurality of dielectric substrates laminated in stacked relationship. Each dielectric substrate has a first and a second surface and has a first conductive layer formed on the first surface thereof. A first pattern of lands is formed in the conductive layer of at least two of the dielectric substrates. The pattern of lands of each dielectric substrate is substantially the same. An opening is formed through each of the lands to expose the respective dielectric substrate. Each of the openings in a respective pattern of lands has a diameter different than at least a portion of the other openings.

Yet another embodiment provides a method of making a printed circuit board for evaluating the process capability of a printed circuit board manufacturing process. The method includes the steps of providing a plurality of dielectric substrates with each dielectric substrate having a first and a second surface, each dielectric substrate having a first conductive layer formed on the first surface thereof; forming a first pattern of lands in the first conductive layer of at least two dielectric substrates, the pattern of lands for each dielectric substrate being substantially the same; forming an opening through each of the lands to expose the respective dielectric substrate, each of the openings in a respective pattern of lands having a diameter different than at least a portion of the other openings, the diameter of each opening of the pattern of each respective dielectric substrate being substantially the same; and laminating in stacked relationship the plurality of dielectric substrates.

Still another embodiment provides a method of using a printed circuit board to evaluate the process capability of a printed circuit board manufacturing process. The method includes the steps of providing a printed circuit board having a plurality of dielectric substrates with each of the dielectric substrates having a first and a second surface and having a first conductive layer formed on its first surface. A first pattern of lands is formed in the conductive layer of at least two of the dielectric substrates. The first pattern of lands of each dielectric substrate are substantially the same. A buss is formed to electrically interconnect the lands of the first pattern of lands of a dielectric substrate. An opening is formed through each of the lands to expose the respective dielectric substrate, each of the openings in a respective pattern of lands having a diameter different than at least a portion of the other openings. The plurality of dielectric substrates are laminated in stacked relationship. The method further includes the steps of forming a through hole in the dielectric substrate in at least a portion of the openings, the diameter of the through hole being less than the diameter of the opening formed in the land; forming a layer of conductive material on an interior surface of each through hole; and performing an electrical performance evaluation on at least a portion of the plated through holes.

As it can be seen, an apparatus according to the illustrative embodiments presented provides several advantages and benefits. The inherent characteristics of a known process for making a PCB may be quantified. It is also advantageous that a non-destructive method of quantifying the PCB manufacturing process capability may be utilized. Furthermore, incorporation of the apparatus is transparent to the manufacture of the PCB. As such, the apparatus does not impart any extraneous characteristics on the PCB.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A printed circuit board comprising:

a plurality of dielectric substrates laminated in stacked relationship, each dielectric substrate having a first and a second surface and having a first conductive layer formed on the first surface thereof;

a first pattern of lands formed in the first conductive layer of at least two of the dielectric substrates, the first pattern of lands of each dielectric substrate being substantially the same as the first pattern of lands of each other dielectric substrate; and an aligned opening formed through each of the lands to expose the respective dielectric substrates, each of the openings in a first respective pattern of lands having a diameter, wherein the diameters of at least a portion of the openings in a respective first pattern of lands are different from one another, and wherein the diameters of a portion of the openings in an adjacent respective first pattern of lands are different from one another but have the same diameter as their respective aligned openings.

2. The printed circuit board of claim 1 wherein the openings are circular shaped.

3. The printed circuit board of claim 1 wherein the lands are circular shaped.

4. The printed circuit board of claim 1 wherein at least a portion of the dielectric substrates have a second conductive layer formed on the second side thereof, the second conductive layer having a first pattern of lands formed therein.

5. The printed circuit board of claim 4 wherein the first pattern of lands on the second side of each respective dielectric substrate is substantially the same as the first pattern of lands on the first side of the respective dielectric substrate.

6. The printed circuit board of claim 1 further comprising a buss formed to electrically interconnect the lands of at least one of the first pattern of lands.

7. The printed circuit board of claim 6 further comprising a common contact, the common contact electrically coupled to the buss.

8. The printed circuit board of claim 1 wherein each pattern of lands includes at least three lands.

9. The printed circuit board of claim 1 further comprising a through hole formed through the printed circuit board adjacent at least a portion of the openings.

10. The printed circuit board of claim 9 wherein a conductive material is formed on an interior surface of the through hole.

11. The printed circuit board of claim 1 further comprising a second pattern of lands formed in the first conductive layer of each dielectric substrate.

12. A computer system comprising:

a microprocessor mounted on a printed circuit board;

an input coupled to provide input to the microprocessor;

a mass storage coupled to the microprocessor;

a display coupled to the microprocessor by a video controller; and a system memory coupled to provide storage to facilitate execution of computer programs by the microprocessor;

the printed circuit board including:

a plurality of dielectric substrates laminated in stacked relationships, each dielectric substrate having a first and a second surface and having a first conductive layer formed on the first surface thereof;

a first pattern of lands formed in the first conductive layer of at least two of the dielectric substrates, the first pattern of lands of each dielectric substrate being substantially the same as the first pattern of lands of each other dielectric substrate; and an aligned opening formed through each of the lands to expose the respective dielectric substrates, each of the openings in a first respective pattern of lands having a diameter, wherein the diameters of at least a portion of the openings in a respective first pattern of lands are different from one another, and wherein the diameters of a portion of the openings in an adjacent respective first pattern of lands are different from one another but have the same diameter as their respective aligned openings.

13. The computer system of claim 12 wherein at least a portion of the dielectric substrates have a second conductive layer formed on the second side thereof, the second conductive layer having a first pattern of lands formed therein.

14. The computer system of claim 13 wherein the first pattern of lands on the second side of each respective dielectric substrate is substantially the same as the first pattern of lands on the first side of the respective dielectric substrate.

15. The computer system of claim 12 further comprising a buss formed to electrically interconnect the lands of at least one of the first pattern of lands.

16. The computer system of claim 15 further comprising a common contact, the common contact electrically coupled to the buss.

* * * * *